(12) United States Patent
Wada

(10) Patent No.: US 6,191,991 B1
(45) Date of Patent: Feb. 20, 2001

(54) DATA RATE CONVERTER

(75) Inventor: Hideaki Wada, Tokyo (JP)

(73) Assignee: Oki Electric Industry Co., Ltd., Tokyo (JP)

( * ) Notice: Under 35 U.S.C. 154(b), the term of this patent shall be extended for 0 days.

(21) Appl. No.: 09/536,764

(22) Filed: Mar. 28, 2000

(30) Foreign Application Priority Data

Apr. 30, 1999 (JP) ................................................ 11-123586

(51) Int. Cl.$^7$ ...................................................... G11C 7/00
(52) U.S. Cl. .......................................... 365/219; 365/220
(58) Field of Search ................................... 365/219, 220, 365/221, 189.01

(56) References Cited

U.S. PATENT DOCUMENTS

| | | | |
|---|---|---|---|
| 4,945,518 | * | 7/1990 | Muramatsu et al. .................. 365/219 |
| 5,508,967 | * | 4/1996 | Karino ................................... 365/220 |
| 5,854,767 | * | 12/1998 | Nishi et al. ........................... 365/219 |

* cited by examiner

*Primary Examiner*—Tan T. Nguyen
(74) *Attorney, Agent, or Firm*—Rabin & Champagne, P.C.

(57) ABSTRACT

In a data rate converter, input data received in series synchronously with an input clock signal is converted into parallel data so as to be written into a memory, and the written parallel data is read from the memory and converted into serial data synchronously with an output clock signal so as to be outputted. Clock pulses of the input clock signal are counted to obtain an input count value. A ready signal is produced based on the input count value for allowing the start of reading the parallel data from the memory. The ready signal has a pulse width greater than two periods of the output clock signal. A trigger signal is produced upon detection of the second leading or trailing edge of the output clock signal within the pulse width of the ready signal. In response to the trigger signal, clock pulses of the output clock signal are counted to obtain an output count value. A read signal is produced based on the output count value for reading the parallel data from the memory.

2 Claims, 7 Drawing Sheets

DATA RATE CONVERTER

BACKGROUND OF THE INVENTION

1. Field of the Invention

The present invention relates to a data rate converter for changing the data rate of a digital signal to enable data transfer between circuits or systems having different data rate requirements.

2. Description of the Related Art

FIG. 12 shows a structure of a conventional data rate converter.

The shown data rate converter receives input data SID inputted in series from a data write-side circuit per frame synchronously with an input clock signal CKA having a stream of clock pulses, and outputs data of given first part of each frame of the input data SID in series synchronously with an output clock signal CKB having a stream of clock pulses as output data SOD to a data read-side circuit.

The data rate converter includes a 2-port random access memory (RAM) 1 which temporarily stores data for data rate conversion. The RAM 1 has a storage area of 32 (words)×8 (bits). The RAM 1 is provided with a data input terminal DI for writing data per word (8 bits), a write address terminal AI, a write control terminal WE, a data output terminal DO for reading stored data per word, and a read address terminal AO.

The input data SID and the input clock signal CKA are inputted into a serial/parallel (S/P) conversion circuit 2. The S/P conversion circuit 2 converts the input data SID inputted in series synchronously with the input clock signal CKA into parallel data per 8 bits and holds it by a latch signal SPL for an output as write data WDT. An output side of the S/P conversion circuit 2 is connected to the data input terminal DI of the RAM 1.

A parallel/serial (P/S) conversion circuit 3 is connected to the data output terminal DO of the RAM 1 for converting read data RDT outputted from the RAM 1 in parallel, into serial data synchronously with the output clock signal CKB. Specifically, the P/S conversion circuit 3 receives 8-bit read data RDT outputted from the data output terminal DO of the RAM 1, at the timing of a latch signal PSL in parallel, and shifts the received data per bit synchronously with the output clock signal CKB for a serial output as output data SOD.

The input clock signal CKA is also fed to a S/P control circuit 4, a write address generating circuit 5 and a write control circuit 6. The S/P control circuit 4 produces a latch signal SPL in the form of a pulse per 8 clock pulses of the input clock signal CKA for feeding to the S/P conversion circuit 2. The write address generating circuit 5 reduces the number of clock pulses of the input clock signal CKA by ⅛ and counts them to sequentially produce write addresses WAD from address 0 (zero) based on the count values. An output side of the write address generating circuit 5 is connected to the write address terminal AI. The write control circuit 6 produces a write enable signal WEN in the form of a pulse per 8 clock pulses of the input clock signal CKA and outputs it to the RAM 1. Further, the write control circuit 6 outputs a ready signal RDY in the form of a pulse to the read side of the data rate converter at every timing when data writing is completed into address 0 (zero) of the RAM 1, and stops outputting a subsequent write enable signal WEN when data writing into address 31 of the RAM 1 is finished. The ready signal RDY has a given pulse width, for example, similar to that of each clock pulse of the output clock signal CKB, and is used for allowing the read side of the data rate converter to start reading data from the RAM 1.

The read side of the data rate converter comprises, in addition to the P/S conversion circuit 3, a read control circuit 7, a read address generating circuit 8 and a P/S control circuit 9. The output clock signal CKB is commonly fed to these circuits.

The read control circuit 7 comprises a D-type flip-flop having a data terminal to which the ready signal RDY is fed, a clock terminal to which the output clock signal CKB is fed, and an output terminal from which a trigger signal TRG in the form of a pulse having a given pulse width is outputted. The trigger signal TRG is given to the read address generating circuit 8 and the P/S control circuit 9. The read address generating circuit 8 starts its operation in response to the trigger signal TRG. The read address generating circuit 8 reduces the number of clock pulses of the output clock signal CKB by ⅛ and counts them to sequentially produce read addresses RAD from address 0 based on the count values. The P/S control circuit 9 starts its operation in response to the trigger signal TRG and produces a latch signal PSL in the form of a pulse per 8 clock pulses of the output clock signal CKB for feeding to the P/S conversion circuit 3.

In the foregoing data rate converter, when input data SID is received per frame synchronously with the input clock signal CKA, the input data SID is converted into parallel write data WDT per 8 bits in the S/P conversion circuit 2 and given to the data input terminal DI of the RAM 1. The write address generating circuit 5 reduces the number of clock pulses of the input clock signal CKA by ⅛ to produce write addresses WAD which are fed to the write address terminal AI in turn. The write control circuit 6 produces a write enable signal WEN per 8 clock pulses of the input clock signal CKA and feeds it to the write control terminal WE of the RAM 1. Accordingly, the input. data SID is stored into the RAM 1 from address 0 to address 31 per word (8 bits) in turn.

After the first word of the input data SID is stored into address 0 of the RAM 1, the write control circuit 6 outputs a ready signal RDY to the read control circuit 7. In response, the read control circuit 7 produces a trigger signal TRG synchronously with the output clock signal CKB and feeds it to the read address generating circuit 8 and the P/S control circuit 9. In response, the read address generating circuit 8 sequentially produces read addresses RAD increasing from address 0 and feeds them to the read address terminal AO in turn. Then, data stored in corresponding storage areas of the RAM 1 are outputted to the data output terminal DO in turn as read data RDT. The read data RDT are read into the P/S conversion circuit 3 in turn by latch signals PSL outputted from the P/S control circuit 9. The P/S conversion circuit 3 converts the read data RDT into serial data synchronously with the output clock signal CKB, and outputs the serial data as output data SOD.

Now, it is assumed that each frame of the input data SID is composed of 512 bits, the input clock signal CKA has a frequency of 4 MHz, and the output clock signal CKB has a frequency of 1.5 MHz. In this case, a ready signal RDY is outputted from the write control circuit 6 when first part 193 bits of a frame of the input data SID are read from the RAM 1 and outputted as output data SOD. Thus, the read address RAD returns to address 0 so that first part 193 bits of the next frame of the input data SID are read and outputted as output data SOD.

However, the foregoing conventional data rate converter has the following problems (1) and (2).

(1) Since the input clock signal CKA and the output clock signal CKB are asynchronous with each other, if the output clock signal CKB rises while the ready signal RDY outputted from the write control circuit 6 is rising (leading edge) or decaying (trailing edge), there is a possibility that the trigger signal TRG is not produced. As a result, the correct timing for reading data from the RAM 1 may not be attained to cause an error in the output data SOD.

(2) If the input clock signal CKA or the output clock signal CKB is omitted due to an influence of noise or the like, the write side timing and the read side timing may deviate from each other to cause an error in the output data SOD.

SUMMARY OF THE INVENTION

Therefore, it is an object of the present invention to provide an improved data rate converter which can solve one or more of the foregoing problems.

According to one aspect of the present invention, there is provided a data rate converter, wherein input data received in series synchronously with an input clock signal having a stream of clock pulses is converted into parallel data per given bits so as to be written into a memory, and the written parallel data is read from the memory per the given bits and converted into serial data synchronously with an output clock signal having a stream of clock pulses so as to be outputted, the data rate converter comprising first counting means for counting the clock pulses of the input clock signal to output an input count value; write control means for producing a write enable signal based on the input count value for writing the parallel data into the memory per the given bits; read starting means for producing a ready signal based on the input count value for allowing the start of reading the parallel data from the memory, the ready signal having a pulse width greater than two periods of the output clock signal; read control means, responsive to the ready signal, for producing a trigger signal upon detection of a leading or trailing edge of a second or subsequent occurrence of the output clock signal within the pulse width of the ready signal; second counting means, responsive to the trigger signal, for counting the clock pulses of the output clock signal to output an output count value; and read signal generating means for producing a read signal based on the output count value for reading the parallel data from the memory per the given bits.

It may be arranged that the data rate converter further comprises phase correcting means for comparing the input count value and the output count value, wherein the phase correcting means corrects the output count value to a predetermined value if the output count value is outside a predetermined value range when the input count value reaches a predetermined value.

BRIEF DESCRIPTION OF THE DRAWINGS

The present invention will be understood more fully from the detailed description given hereinbelow, taken in conjunction with the accompanying drawings.

In the drawings.

DESCRIPTION OF THE PREFERRED EMBODIMENT

Now, preferred embodiments of the present invention will be described hereinbelow with reference to the accompanying drawings.

<First Embodiment>

Figure 1:
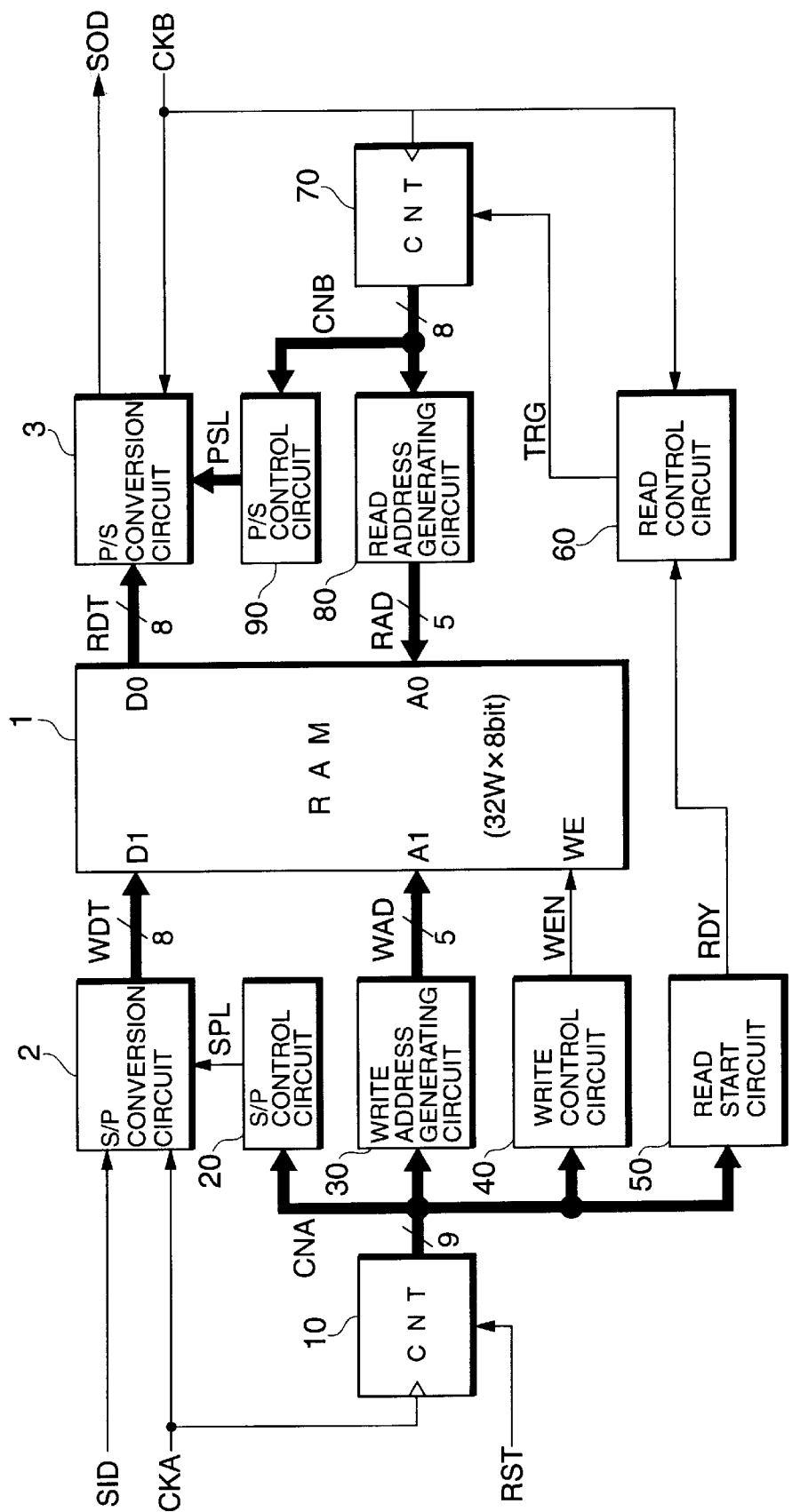
FIG. 1 is a diagram showing a structure of a data rate converter according to a first preferred embodiment of the present invention.

FIG. 1 shows a structure of a data rate converter according to the first preferred embodiment of the present invention.

Figure 12:
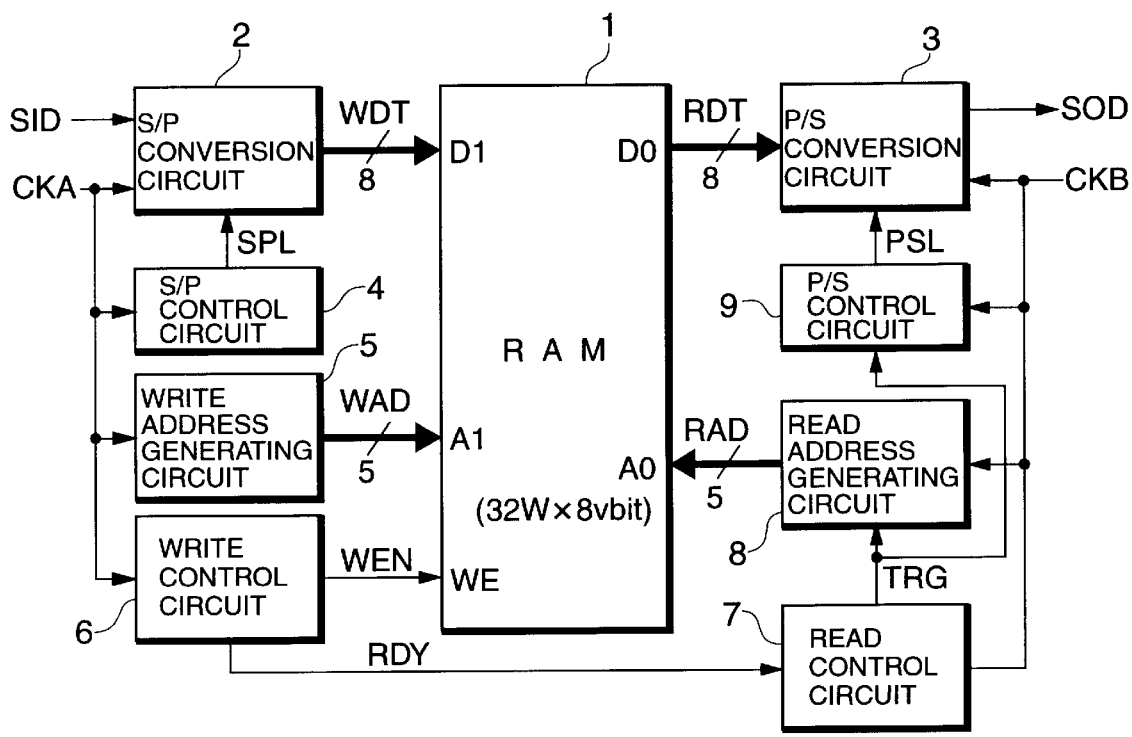
FIG. 12 is diagram showing a conventional data rate converter.

Like the data rate converter shown in FIG. 12, the data rate converter in this embodiment receives input data SID inputted in series from a data write-side circuit per frame of 512 bits synchronously with an input clock signal CKA of 4 MHz having a stream of clock pulses, and outputs data of first part 193 bits of each frame of the input data SID in series synchronously with an output clock signal CKB of 1.5 MHz having a stream of clock pulses, as output data SOD to a data read-side circuit.

In FIG. 1, the data rate converter comprises a 2-port random access memory (RAM) 1 which temporarily stores data for data rate conversion. The RAM 1 has a storage area of 32 words each composed of 8 bits. The RAM 1 is provided with a data input terminal DI for writing data per word (8 bits), a write address terminal AI, a write control terminal WE, a data output terminal DO for reading stored data per word, and a read address terminal AO.

The input data SID and the input clock signal CKA are fed to a serial/parallel (S/P) conversion circuit 2. The S/P conversion circuit 2 comprises an 8-bit serial-input parallel-output shift register and an 8-bit data latch. The input data SID is held in the shift register in sequence synchronously with the input clock signal CKA and then stored in the data latch by a latch signal SPL. An output side of the S/P conversion circuit 2 is connected to the data input terminal DI of the RAM 1, and the 8-bit parallel data stored in the data latch of the S/P conversion circuit 2 is outputted as write data WDT.

A parallel/serial (P/S) conversion circuit 3 is connected to the data output terminal DO of the RAM 1 for converting read data RDT outputted from the RAM 1 in parallel, into serial data synchronously with the output clock signal CKB. Specifically, the P/S conversion circuit 3 comprises an 8-bit parallel-input serial-output shift register which receives 8-bit read data RDT outputted from the data output terminal DO of the RAM 1, at the timing of a latch signal PSL in parallel, and shifts the received data per bit synchronously with the output clock signal CKB for a serial output as output data SOD.

The input clock signal CKA is also fed to a counting circuit 10 in the form of a 9-bit binary counter. The counter 10 is reset by a reset signal RST and, when the reset signal RST is released, starts counting up clock pulses of the input clock signal CKA synchronously with the leading edge of each pulse so as to output an input count value CNA. To an output side of the counter 10 are connected a S/P control circuit 20, a write address generating circuit 30, a write control circuit 40 and a read start circuit 50.

Based on the input count value CNA, the S/P control circuit 20 sequentially produces latch signals SPL each in the form of a pulse for feeding to the SIP conversion circuit 2. Based on the input count value CNA, the write address generating circuit 30 sequentially produces write addresses WAD with respect to the RAM 1. An output side of the write address generating circuit 30 is connected to the write address terminal AI of the RAM 1. Based on the input count value CNA, the write control circuit 40 sequentially produces write enable signals WEN each in the form of a pulse for feeding to the write control terminal WE of the RAM 1. Based on the input count value CNA, the read start circuit 50 outputs a ready signal RDY in the form of a pulse to a read control circuit 60 on the read side of the data rate converter at every timing when data writing into address 0 of the RAM 1 is completed. The ready signal RDY has a predetermined pulse width which will be described later in detail. The ready signal RDY is used for allowing the read side of the data rate converter to start reading data from the RAM 1. The read control circuit 60 produces a trigger signal TRG in the form of a pulse indicative of the read start timing based on the ready signal RDY and the output clock signal CKB.

The output clock signal CKB is also fed to a counting circuit 70 in the form of an 8-bit binary counter. The counter 70 is reset by the trigger signal TRG and then counts up clock pulses of the output clock signal CKB synchronously with the leading edge of each pulse so as to output an output count value CNB. To an output side of the counter 70 are connected a read address generating circuit 80 and a P/S control circuit 90. Based on the output count value CNB, the read address generating circuit 80 sequentially produces read addresses RAD with respect to the RAM 1. An output side of the read address generating circuit 80 is connected to the read address terminal AO. Based on the output count value CNB, the P/S control circuit 90 sequentially produces latch signals PSL each in the form of a pulse for feeding to the P/S conversion circuit 3.

Figure 2:
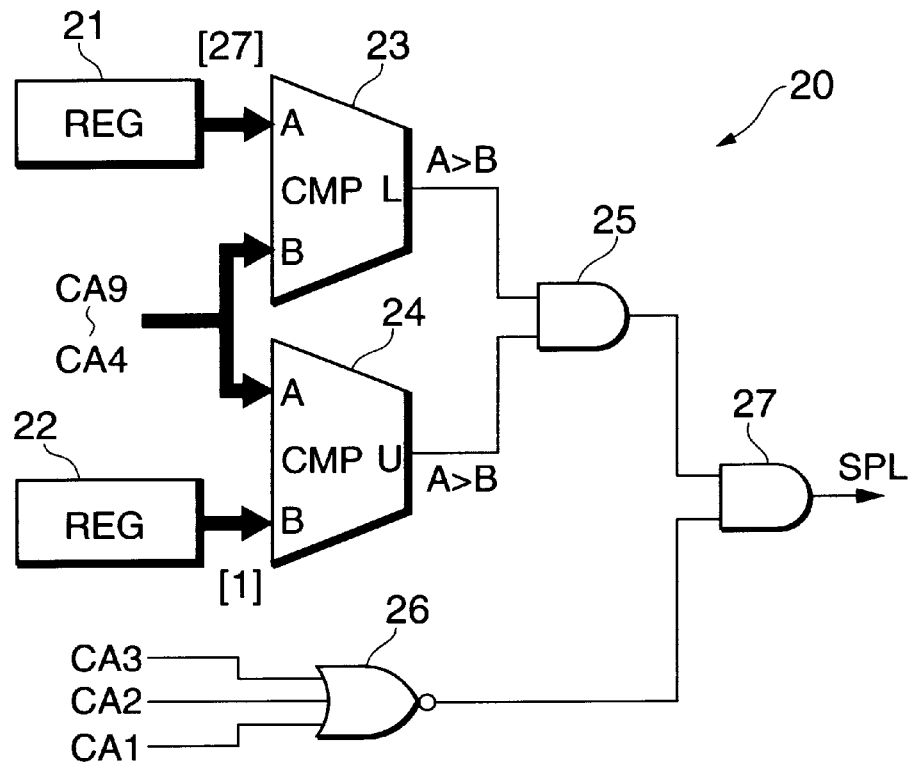
FIG. 2 is a diagram showing a S/P control circuit shown in FIG. 1.

FIG. 2 shows a structure of the S/P control circuit 20 shown in FIG. 1.

The S/P control circuit 20 comprises registers 21 and 22 for setting the upper limit and the lower limit of the input count value CNA for producing latch signals SPL. The register 21 is connected to a terminal A of a comparator 23, while the register 22 is connected to a terminal B of a comparator 24. Signals CA4 to CA9 representing upper 6 bits of the input count value CNA are fed to a terminal B of the comparator 23 and a terminal A of the comparator 24. The comparator 23 outputs a High signal from its terminal L when a value given to the terminal B is smaller than a value given to the terminal A. On the other hand, the comparator 24 outputs a High signal from its terminal U when a value given to the terminal A is greater than a value given to the terminal B. The terminal L of the comparator 23 and the terminal U of the comparator 24 are connected to an input side of a 2-input AND gate 25.

The S/P control circuit 20 further includes a 3-input NOR gate 26. Signals CA1 to CA3 representing lower 3 bits of the input count value CNA are fed to input terminals of the NOR gate 26. Output sides of the AND gate 25 and the NOR gate 26 are connected to an input side of a 2-input AND gate 27 which outputs a latch signal SPL.

In the SIP control circuit 20, a value "27" is set in the register 21 while a value "1" is set in the register 22. Accordingly, the first latch signal SPL is outputted when the input count value CNA reaches a value "16". Thereafter, a latch signal SPL is outputted every time the input count value CNA increases by 8. After 25 latch signals SPL are outputted, the S/P control circuit 20 stops outputting a subsequent latch signal SPL.

Figure 3:
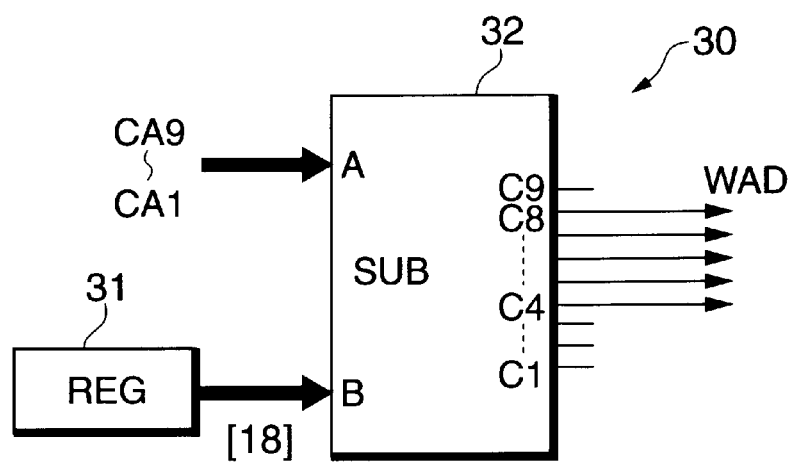
FIG. 3 is a diagram showing a write address generating circuit shown in FIG. 1.

FIG. 3 shows a structure of the write address generating circuit 30 shown in FIG. 1.

The write address generating circuit 30 comprises a register 31 and a subtracter 32. The subtracter 32 subtracts a value given to a terminal B from a value given to a terminal A, and outputs a result of the subtraction from terminals C1 to C9 in a 9-bit binary number. The signals CA1 to CA9 representing 9 bits of the input count value CNA are fed to the terminal A of the subtracter 32, while the register 31 is connected to the terminal B thereof. The subtracter 32 outputs a write address WAD with respect to the RAM 1 in a 5-bit binary number from the terminals C4 to C8. In the write address generating circuit 30, a value "18" is set in the register 31. Accordingly, 5-bit signals CA4 to CA8 of a value obtained by subtracting "18" from the input count value CNA are outputted as a write address WAD.

Figure 4:
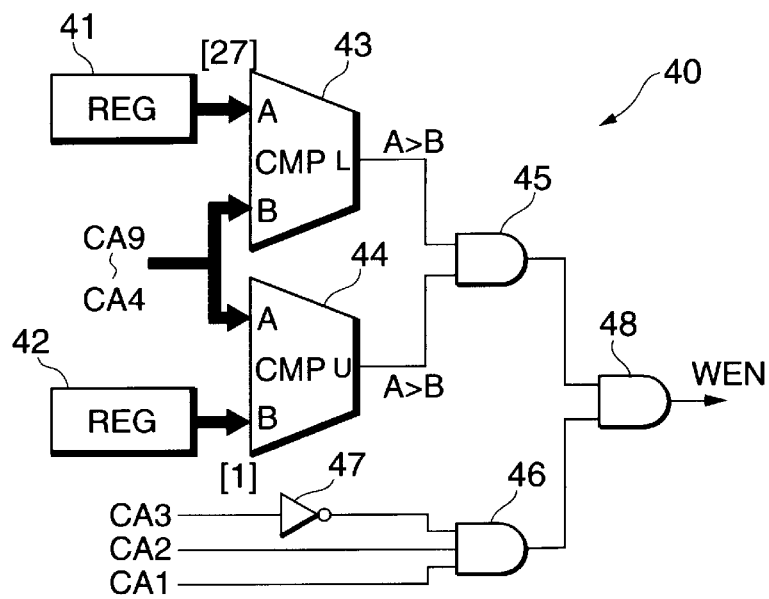
FIG. 4 is a diagram showing a write control circuit shown in FIG. 1.

FIG. 4 shows a structure of the write control circuit 40.

The write control circuit 40 comprises registers 41 and 42 for setting the upper limit and the lower limit of the input count value CNA for producing write enable signals WEN. The register 41 is connected to a terminal A of a comparator 43, while the register 42 is connected to a terminal B of a comparator 44. The comparators 43 and 44 are the same as the comparators 23 and 24 of the S/P control circuit 20, respectively. The signals CA4 to CA9 representing the upper 6 bits of the input count value CNA are fed to a terminal B of the comparator 43 and a terminal A of the comparator 44. A terminal L of the comparator 43 and a terminal U of the comparator 44 are connected to an input side of a 2-input AND gate 45.

The write control circuit 40 further includes a 3-input AND gate 46. The signals CA1 and CA2 of the input count value CNA are fed to input terminals of the AND gate 46, and the signal CA3 of the input count value CNA is fed to the other input terminal of the AND gate 46 via an inverter 47. Output sides of the AND gates 45 and 46 are connected to an input side of a 2-input AND gate 48 which outputs a write enable signal WEN.

In the write control circuit 40, a value "27" is set in the register 41, while a value "1" is set in the register 42. Accordingly, the first write enable signal WEN is outputted when the input count value CNA reaches a value "19". Thereafter, a write enable signal WEN is outputted every time the input count value CNA increases by 8. After 25 write enable signals WEN are outputted, the write control circuit 40 stops outputting a subsequent write enable signal WEN.

Figure 5:
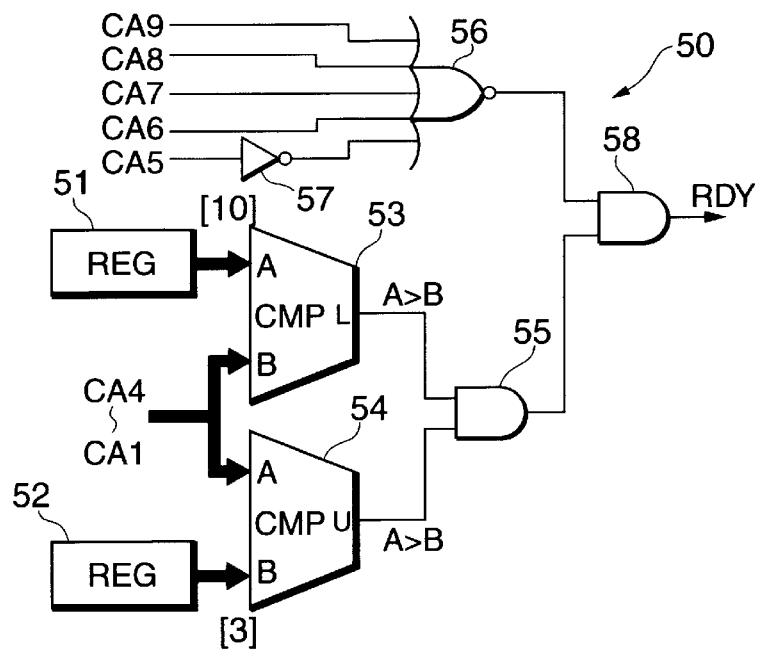
FIG. 5 is a diagram showing a read start circuit shown in FIG. 1.

FIG. 5 shows a structure of the read start circuit 50 shown in FIG. 1.

The read start circuit 50 comprises registers 51 and 52 for setting the start timing and the end timing with respect to the input count value CNA for producing a ready signal RDY having a predetermined pulse width. The register 51 is connected to a terminal A of a comparator 53, while the register 52 is connected to a terminal B of a comparator 54. The comparators 53 and 54 are the same as the comparators 23 and 24 of the S/P control circuit 20, respectively. The signals CA1 to CA4 representing the lower 4 bits of the input count value CNA are given to a terminal B of the comparator 53 and a terminal A of the comparator 54. A terminal L of the comparator 53 and a terminal U of the comparator 54 are connected to an input side of a 2-input AND gate 55.

The read start circuit 50 further includes a 5-input NOR gate 56. The signal CA5 is fed to an input terminal of the NOR gate 56 via an inverter 57, while the signals CA6 to CA9 are fed to the other input terminals of the NOR gate 56. Output sides of the AND gate 55 and the NOR gate 56 are connected to an input side of a 2-input AND gate 58 which outputs a ready signal RDY.

In the read start circuit 50, a value "10" is set in the register 51, while a value "3" is set in the register 52. Accordingly, the ready signal RDY is outputted only when the input count value CNA is in the range of "20" to "25".

Figure 6:
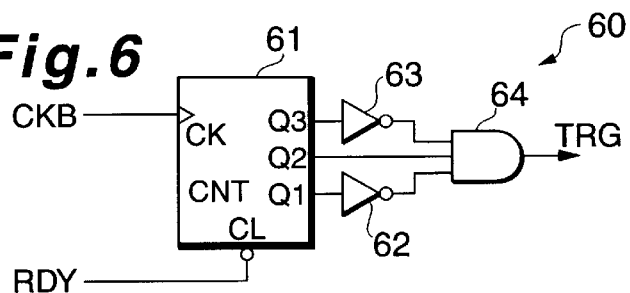
FIG. 6 is a diagram showing a read control circuit shown in FIG. 1.

FIG. 6 shows a structure of the read control circuit 60 shown in FIG. 1.

The read control circuit 60 comprises a 3-bit binary counter 61. The ready signal RDY is fed to a clear terminal CL of the counter 61, while the output clock signal CKB is fed to a clock terminal CK thereof. When the ready signal RDY is not given to the clear terminal CL, i.e. when the signal level fed to the clear terminal CL is Low, the counter 61 is reset to "0" and stops its counting operation. On the other hand, when the ready signal RDY is given to the clear terminal CL, i.e. the signal level fed to the clear terminal CL is High, the counter 61 counts up clock pulses of the output clock signal CKB synchronously with the leading edge of each pulse. An output terminal Q2 of the counter 61 is connected to an input terminal of a 3-input AND gate 64, while output terminals Q1 and Q3 thereof are connected to the other input terminals of the AND gate 64 via inverters 62 and 63, respectively. A trigger signal TRG is outputted from an output side of the AND gate 64.

Figure 7:
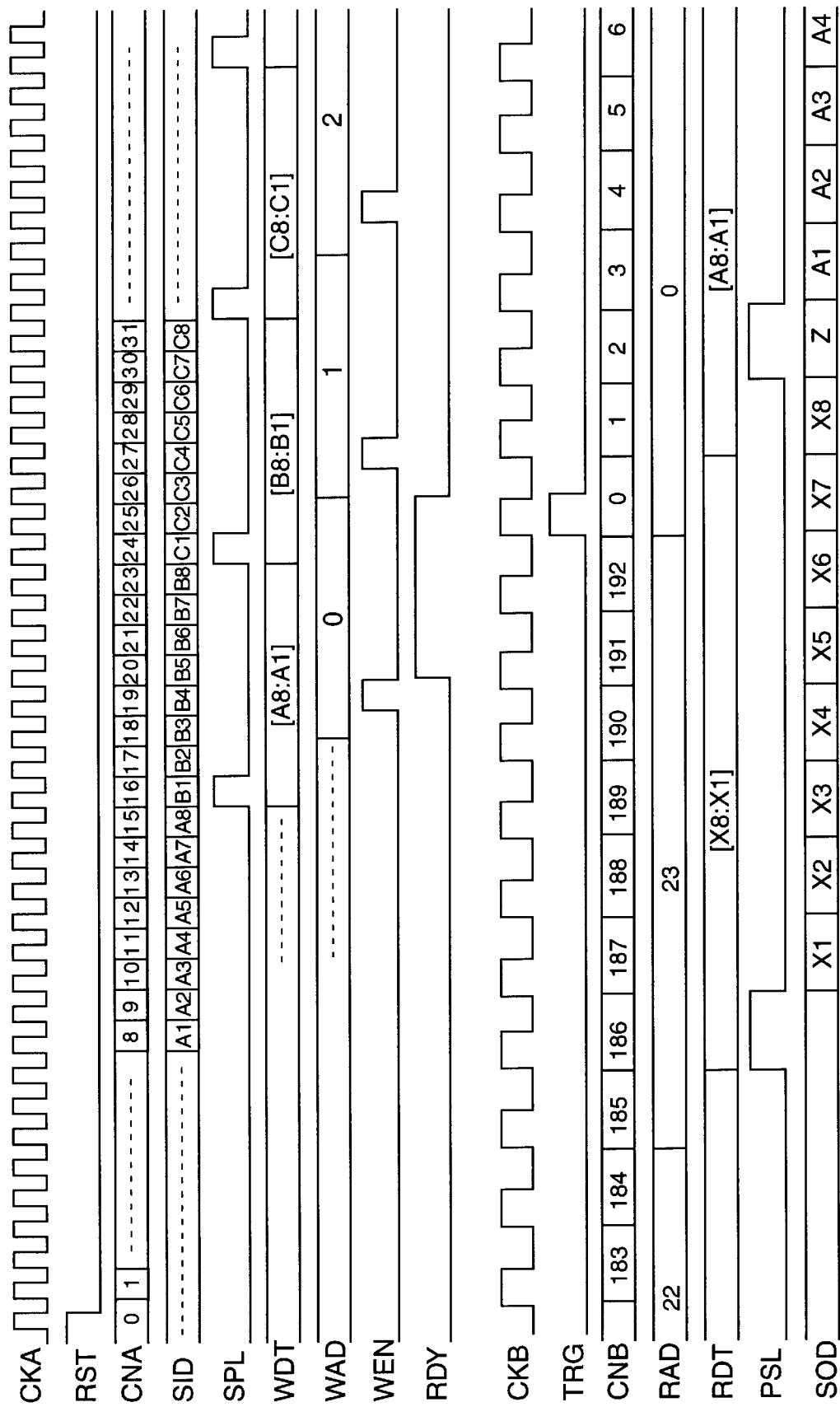
FIG. 7 is a sequence diagram for explaining an operation of the data rate converter shown in FIG. 1.

FIG. 7 is a sequence diagram for explaining an operation of the data rate converter shown in FIG. 1.

The input clock signal CKA of 4 MHz and the output clock signal CKB of 1.5 MHz are consecutively fed to the data rate converter from the data write-side circuit and the data read-side circuit, respectively.

When the reset signal RST changes from High to Low, the counter 10 starts counting so that the input count value CNA is counted up by one synchronously with the leading edge of each pulse of the input clock signal CKA. When the input count value CNA reaches "8", inputting of the effective input data SID is started from the data write-side circuit.

In the S/P conversion circuit 2, the input data SID given in series synchronously with the input clock signal CKA is converted into 8-bit parallel data.

When the input count value CNA reaches "16", the S/P control circuit 20 outputs a latch signal SPL, so that the 8-bit parallel data converted in the S/P conversion circuit 2 is held by the latch signal SPL and outputted to the RAM 1 as write data WDT [A8:A1]. Thereafter, subsequent input data SID is converted into 8-bit parallel data per 8 clock pulses of the input clock signal CKA and outputted as write data WDT.

When the input count value CNA reaches "18", a write address WAD utputted from the write address generating circuit 30 becomes "0". Thereafter, a write address WAD is counted up by one per 8 clock pulses of the input clock signal CKA.

When the input count value CNA reaches "19", the write control circuit 40 outputs a write enable signal WEN. Thus, the data [A8:A1] is written into address 0 of the RAM 1. The write enable signal WEN is outputted per 8 clock pulses of the input clock signal CKA so that write data WDT are written into addresses 0 to 24 of the RAM 1 in sequence.

When the input count value CNA reaches "20", a ready signal RDY is outputted from the read start circuit 50. The ready signal RDY continues to be outputted while the input count value CNA is in the range of "20" to "25".

When the ready signal RDY is outputted, i.e. when the signal level becomes High, the read control circuit 60 starts counting the number of clock pulses of the output clock signal CKB and outputs a trigger signal TRG at the timing of the second leading edge of the output clock signal CKB while the input count value CNA is in the range of "20" to "25". When the trigger signal TRG is outputted, the output count value CNB is reset. Then, when the trigger signal TRG is released, the counter 70 counts up the output count value CNB from "0" synchronously with the leading edge of each pulse of the output clock signal CKB.

The output count value CNB counted by the counter 70 is given to the read address generating circuit 80 where the read address RAD is set to "0" in response to "0" of the output count value CNB. Accordingly, the data [A8:A1] written into address 0 of the RAM 1 is read from the data output terminal DO and outputted as read data RDT The output count value CNB is also fed to the P/S control circuit 90. When the output count value CNB reaches "2", the P/S control circuit 90 outputs a latch signal PSL to the P/S conversion circuit 3. Accordingly, the data [A8:A1] read from the RAM 1 is held in the P/S conversion circuit 3. The data [A8:A1] held in the P/S conversion circuit 3 is converted into serial data synchronously with the output clock signal CKB and outputted as output data SOD. The latch signal PSL is outputted per 8 clock pulses of the output clock signal CKB so that read data RDT read from addresses 0 to 24 of the RAM 1 are held by the latch signals PSL in turn and converted into serial data synchronously with the output clock signal CKB as output data SOD.

As described before, the frequencies of the input clock signal CKA and the output clock signal CKB are set to 4 MHz and 1.5 MHz, respectively. Accordingly, only the first part 193 bits of each frame (512 bits) of input data SID are converted and outputted as output data SOD.

As described above, in this embodiment, the data rate converter is arranged such that the ready signal RDY has a pulse width which is greater than two periods of the output clock signal CKB, and the trigger signal TRG is outputted at the timing of the second leading edge of the output clock signal CKB during the ready signal RDY being outputted, i.e. within the pulse width of the ready signal RDY. Accordingly, since the pulse width of the ready signal RDY is sufficiently large relative to the period of the output clock signal CKB, the second leading edge of the output clock signal CKB can be always detected reliably within the pulse width of the ready signal RDY As a result, the trigger signal TRG can be reliably outputted without being affected by a phase difference between the input clock signal CKA and the output clock signal CKB so that the accurate read timing can be ensured.

In this embodiment, the second leading edge of the output clock signal CKB is used for outputting the trigger signal TRG. Instead, the second trailing edge of the output clock signal CKB may be used for outputting the trigger signal TRG.

<Second Embodiment>

Figure 8:
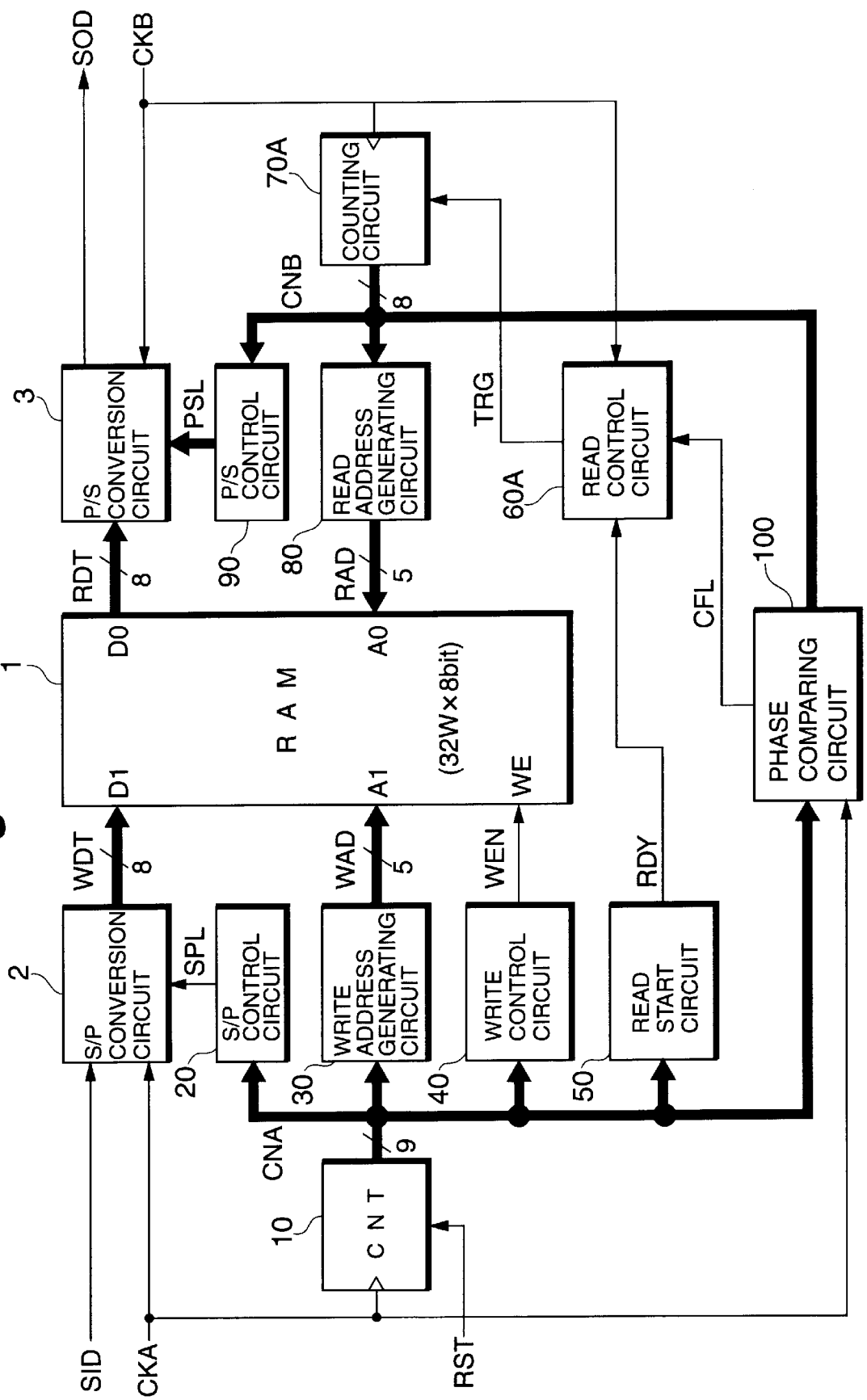
FIG. 8 is a diagram showing a structure of a data rate converter according to a second preferred embodiment of the present invention.

FIG. 8 shows a structure of a data rate converter according to the second preferred embodiment of the present invention. In FIG. 8, the same elements as those in FIG. 1 are assigned the same reference signs.

In this embodiment, the data rate converter is provided with a phase comparing circuit 100 which compares the input count value CNA and the output count value CNB at the timing of the leading edge of the input clock signal CKA, and outputs a phase comparison signal CFL based on a result of the comparison. Further, the data rate converter includes, instead of the read control circuit 60 shown in FIG. 1, a read control circuit 60A which outputs a trigger signal TRG based on a ready signal RDY and the phase comparison signal CFL, and further includes, instead of the counter 70 shown in FIG. 1, a counting circuit 70A having an additional function. The other structure is the same as that of the first preferred embodiment.

Figure 9:
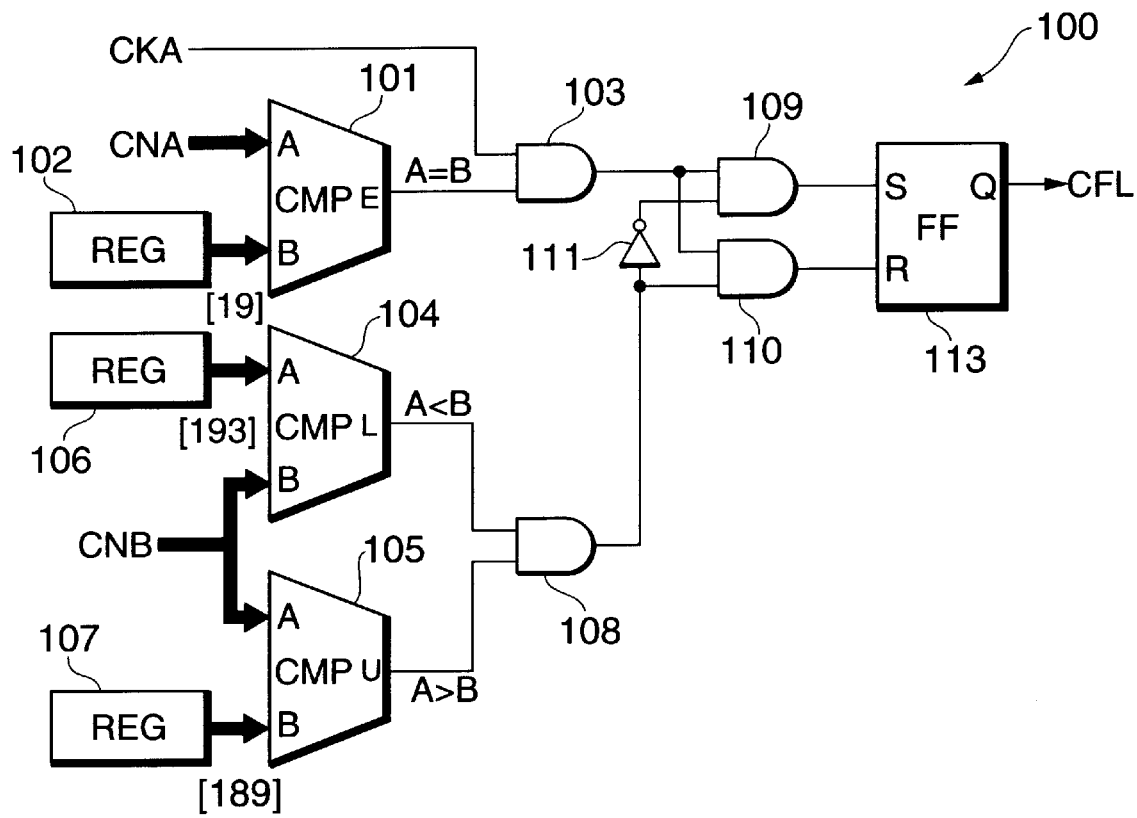
FIG. 9 is a diagram showing a phase comparing circuit shown in FIG. 8.

FIG. 9 shows a structure of the phase comparing circuit 100 shown in FIG. 8.

The phase comparing circuit 100 comprises a comparator 101 for judging whether the input count value CNA is a predetermined value ("19" in this embodiment), and a register 102 for setting such a predetermined value. A result of the comparison of the comparator 101 is given to an input terminal of a 2-input AND gate 103, and the input clock signal CKA is given to the other input terminal of the AND gate 103.

The phase comparing circuit 100 further comprises comparators 104 and 105 for judging whether the output count value CNB is within a predetermined range ("190" to "192" in this embodiment), and registers 106 and 107 for setting such a predetermined range. A value "193" is set in the register 106 while a value "189" is set in the register 107. The comparator 104 outputs a High signal from its output terminal L when a value given to a terminal A is greater than a value given to a terminal B. The comparator 105 outputs a High signal from its output terminal U when a value given to a terminal A is greater than a value given to a terminal B. The output terminals L and U of the comparators 104 and 105 are connected to input terminals of a 2-input AND gate 108.

An output side of the AND gate 103 is connected to an input terminal of a 2-input AND gate 109 and an input terminal of a 2-input AND gate 110. An output side of the AND gate 108 is connected to the other input terminal of the AND gate 110 and also connected via an inverter 111 to the other input terminal of the AND gate 109. Output sides of the AND gates 109 and 110 are connected to a set terminal S and a reset terminal R of a R-S flip-flop 113, respectively. The phase comparison signal CFL is outputted from the flip-flop 113.

Figure 10:
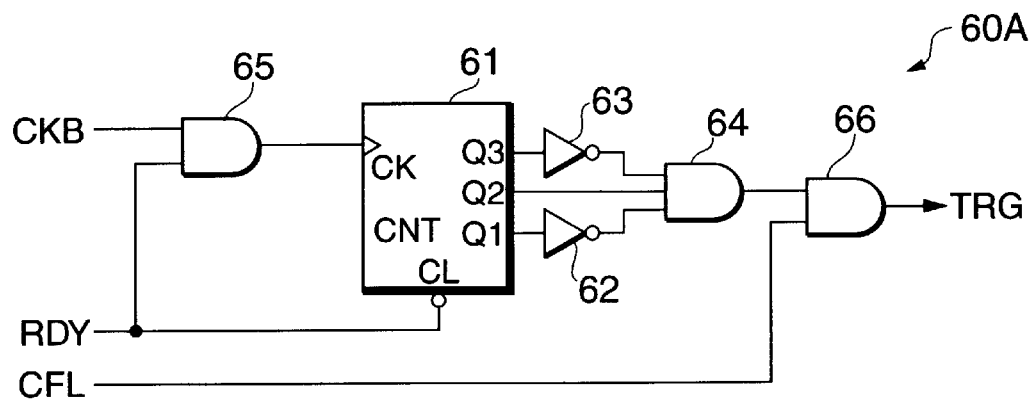
FIG. 10 is a diagram showing a read control circuit shown in FIG. 8.

FIG. 10 shows a structure of the read control circuit 60A shown in FIG. 8. In FIG. 10, the same elements as those in FIG. 6 are assigned the same reference signs.

In the read control circuit 60A, the output clock signal CKB is fed to the clock terminal CK of the counter 61 via a 2-input AND gate 65 whose operation is controlled by the ready signal RDY inputted thereto. Further, an output side of the AND gate 64 is connected to an input side of a 2-input AND gate 66 whose operation is controlled by the phase comparison signal CFL inputted thereto. The trigger signal TRG is outputted from the AND gate 66.

Figure 11:
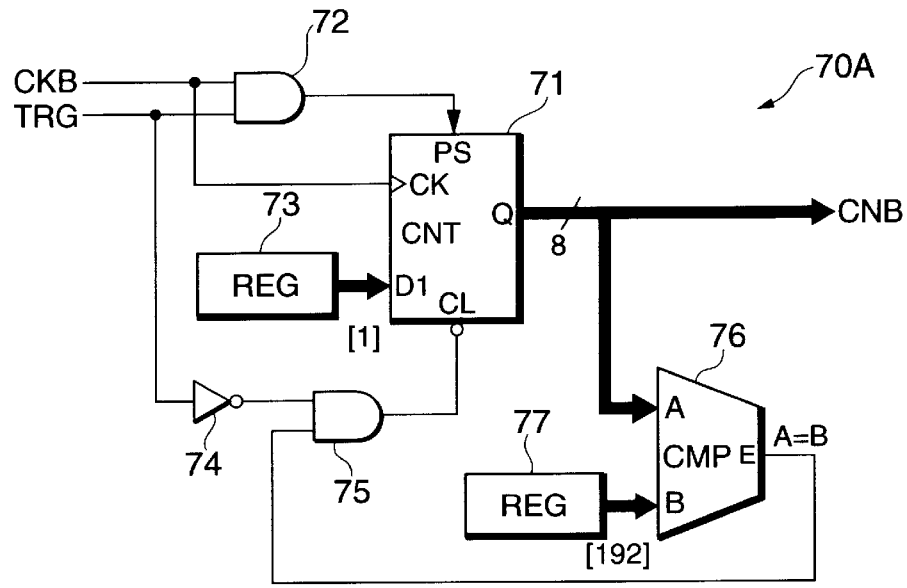
FIG. 11 is a diagram showing a counting circuit shown in FIG. 8.

FIG. 11 shows a structure of the counting circuit 70A shown in FIG. 8.

The counting circuit 70A comprises an 8-bit preset-type counter 71. The output clock signal CKB is fed to a clock terminal CK of the counter 71, while the output clock signal CKB and the trigger signal TRG are fed to a preset terminal PS of the counter 71 via a 2-input AND gate 72. A register 73 for setting an initial value ("1" in this embodiment) is connected to a data input terminal DI of the counter 71.

The trigger signal TRG is also fed to an input terminal of a 2-input AND gate 75 via an inverter 74, and an output side of the AND gate 75 is connected to a clear terminal CL of the counter 71. The output count value CNB is outputted from an output terminal Q of the counter 71 to be fed to the read address generating circuit 80, the P/S control circuit 90 and the phase comparing circuit 100, and also fed to a terminal A of a counter 76. To a terminal B of the counter 76 is connected a register 77 which is set to a given value ("192" in this embodiment). The counter 76 outputs a High signal from a terminal E when values given to the terminals A and B are equal to each other. The terminal E of the counter 76 is connected to the other input terminal of the AND gate 75.

A start control on the read side of the data rate converter having the foregoing structure will be described hereinbelow.

In the phase comparing circuit 100, if the input count value CNA is "19" when the input clock signal CKA is High, the AND gate 103 outputs a High signal. At this time, if the output count value CNB is in the range of "190" to "192", the AND gate 108 outputs a High signal. Accordingly, the flip-flop 113 is reset so that the phase comparison signal CFL becomes Low. On the other hand, if the input count value CNA is "19" when the input clock signal CKA is High while the output count value CNB is other than "190" to "192", the flip-flop 113 is set so that the phase comparison signal CFL becomes High. Further, if the input count value CNA is not "19", the AND gate 103 outputs a Low signal so that the phase comparison signal CFL from the flip-flop 113 is unchanged.

In the read control circuit 60A, when the output clock signal CKB rises while the ready signal RDY is outputted, i.e. while the signal level is High, the counter 61 counts up synchronously with the leading edge of each pulse of the output clock signal CKB. Then, when the counter 61 counts up to a value "2", the AND gate 64 outputs a High signal. At this time, if the phase comparison signal CFL is High, the trigger signal TRG is outputted from the AND gate 66. On the other hand, if the phase comparison signal CFL is Low, the trigger signal TRG is not outputted.

In the counting circuit 70A, when the output clock signal CKB rises while the trigger signal TRG is outputted, i.e. while the signal level is High, the initial value "1" set in the register 73 is set in the counter 71 so that the output count value CNB becomes "1". On the other hand, while the output count value CNB does not reach "192" with no trigger signal TRG being outputted, the counter 71 counts up synchronously with the leading edge of each pulse of the output clock signal CKB. Then, when the output count value CNB reaches "192" with no trigger signal TRG being outputted, the counter 71 is reset so that the output count value CNB becomes "0".

Accordingly, if the output count value CNB is other than "190" to "192" when the input count value CNA is "19", it is assumed that there is a disagreement between the input count value CNA and the output count value CNB, and hence the phase comparison signal CFL is set High so that the trigger signal TRG is outputted to cause the output count value CNB to be "1". On the other hand, if the output count value CNB is "190" to "192" when the input count value CNA is "19", it is assumed that the input count value CNA and the output count value CNB agree with each other, and hence the output count value CNB is set to "0" after counting to "192", i.e. without forcibly setting the output count value CNB to "1" by outputting the trigger signal TRG.

As described above, in this embodiment, the data rate converter is arranged such that the input count value CNA and the output count value CNB are cyclically compared with each other and, when there is a disagreement therebetween, the output count value CNB is initialized to a predetermined value. Thus, even if the output clock signal CKB is omitted due to an influence of noise or the like, the normal state can be restored to prevent omission or overlapping of data read from the RAM 1.

While the present invention has been described in terms of the preferred embodiments, the invention is not to be limited thereto, but can be embodied in various ways without departing from the principle of the invention as defined in the appended claims.

For example, the frequencies of the input clock signal CKA and the output clock signal CKB are not limited to 4 MHz and 1.5 MHz, respectively. The present invention is applicable to desired frequencies of the input clock signal CKA and the output clock signal CKB. For example, the present invention is applicable to a case wherein the frequency of the input clock signal CKA is lower than that of the output clock signal CKB. In this case, it is necessary to set the output timing of the ready signal RDY according to a format of input data.

Further, the capacity of the RAM 1 is not limited to 32 (words)×8 (bits). It is necessary to select the adequate capacity depending on a format of input data or the clock signal frequencies.

The trigger signal TRG is outputted at the timing of the second leading edge of the output clock signal CKB during the ready signal RDY being outputted in the foregoing first and second preferred embodiments. However, as described before, the trigger signal TRG may be outputted at the timing of the second trailing edge of the output clock signal CKB during the ready signal RDY being outputted. Further, the output timing of the trigger signal TRG is not limited to the second leading or trailing edge of the output clock signal CKB, i.e. the trigger signal TRG may be outputted at the timing of a subsequent leading or trailing edge (a leading or trailing edge subsequent to the second leading or trailing edge) of the output clock signal CKB during the ready signal RDY being outputted.

Further, the timing relationship of the signals shown in FIG. 7 is only an example, and thus the present invention is not limited thereto. It is necessary to set the signal timing relationship according to an applying data rate converter.

Further, the structures of the respective circuits are not limited to those shown in the figures. Any circuit structures may be used as long as they can provide similar functions as those of the shown circuits.

What is claimed is:

1. A data rate converter, wherein input data received in series synchronously with an input clock signal having a stream of clock pulses is converted into parallel data per given bits so as to be written into a memory, and the written parallel data is read from the memory per said given bits and converted into serial data synchronously with an output clock signal having a stream of clock pulses so as to be outputted, said data rate converter comprising:

first counting means for counting the clock pulses of said input clock signal to output an input count value;

write control means for producing a write enable signal based on said input count value for writing the parallel data into said memory per said given bits;

read starting means for producing a ready signal based on said input count value for allowing the start of reading the parallel data from said memory, said ready signal having a pulse width greater than two periods of said output clock signal;

read control means, responsive to said ready signal, for producing a trigger signal upon detection of a leading or trailing edge of a second or subsequent occurrence of said output clock signal within said pulse width of the ready signal;

second counting means, responsive to said trigger signal, for counting the clock pulses of said output clock signal to output an output count value; and read signal generating means for producing a read signal based on said output count value for reading the parallel data from said memory per said given bits.

2. The data rate converter according to claim 1, further comprising phase correcting means for comparing said input count value and said output count value, wherein said phase correcting means corrects said output count value to a predetermined value if said output count value is outside a predetermined value range when said input count value reaches a predetermined value.

* * * * *